United States Patent
Miyokawa et al.

(10) Patent No.: US 10,978,851 B2
(45) Date of Patent: Apr. 13, 2021

(54) PACKAGE FOR OPTICAL DEVICE AND OPTICAL DEVICE MODULE

(71) Applicant: FURUKAWA ELECTRIC CO., LTD., Tokyo (JP)

(72) Inventors: Jun Miyokawa, Tokyo (JP); Masakazu Miura, Tokyo (JP); Kazuki Yamaoka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/529,966

(22) Filed: Aug. 2, 2019

(65) Prior Publication Data
US 2019/0372303 A1    Dec. 5, 2019

Related U.S. Application Data

(63) Continuation of application No. PCT/JP2018/005050, filed on Feb. 14, 2018.

(30) Foreign Application Priority Data

Feb. 14, 2017    (JP) .............................. JP2017-025249

(51) Int. Cl.
| | | |
|---|---|---|
| *H01S 5/022* | (2021.01) | |
| *G02B 6/42* | (2006.01) | |
| *H01S 5/02208* | (2021.01) | |

(52) U.S. Cl.
CPC ........ *H01S 5/02208* (2013.01); *G02B 6/4251* (2013.01); *H01S 5/02284* (2013.01); *H01S 5/02288* (2013.01)

(58) Field of Classification Search
CPC ......... H01S 5/022; H01S 5/40; G02B 6/4251; G06K 15/12

(Continued)

(56) References Cited

U.S. PATENT DOCUMENTS 6,435,736 B1 *  8/2002  Irie ...................... G02B 6/4202
                                                          385/88
8,342,756 B2     1/2013  Moidu et al.
(Continued)

FOREIGN PATENT DOCUMENTS

| JP | 54-42161 A | 4/1979 |
|---|---|---|
| JP | 7-92335 A | 4/1995 |

(Continued)

OTHER PUBLICATIONS

International Search Report dated May 1, 2018 in PCT/JP2018/005050 filed Feb. 14, 2018 (with English translation).

(Continued)

*Primary Examiner* — Tuan N Nguyen
(74) *Attorney, Agent, or Firm* — Oblon, McClelland, Maier & Neustadt, L.L.P.

(57) ABSTRACT

Provided is a package for an optical device and an optical device module that can reduce or prevent damage occurrence in an optical fiber optically coupled to an optical device while ensuring a good airtightness. A package for an optical device includes a package main unit that accommodates an optical device; a pipe portion that is provided in the package main unit and through which an optical fiber optically coupled to the optical device is inserted; and a fixing portion that is provided in the package main unit and to which one end of the optical fiber is fixed, and the pipe portion includes a first pipe section having a base end fixed to the package main unit and a second pipe section joined to a tip of the first pipe section, having a higher thermal expansion coefficient than the first pipe section, to be sealed by a sealing material.

7 Claims, 15 Drawing Sheets

(58) Field of Classification Search
USPC .................................. 385/92; 257/81; 372/31
See application file for complete search history.

(56) References Cited

U.S. PATENT DOCUMENTS

| | | | | |
|---|---|---|---|---|
| 2002/0154872 | A1* | 10/2002 | Miyokawa | G02B 6/4251 385/92 |
| 2003/0076861 | A1 | 4/2003 | Dharia et al. | |
| 2006/0104575 | A1* | 5/2006 | Ikeda | G02B 6/4266 385/88 |
| 2008/0025677 | A1* | 1/2008 | Sasaki | G02B 6/381 385/94 |
| 2017/0031116 | A1* | 2/2017 | Carralero | G02B 6/1225 |
| 2017/0139161 | A1 | 5/2017 | Yamaoka et al. | |

FOREIGN PATENT DOCUMENTS

| | | |
|---|---|---|
| JP | 2002-258111 A | 9/2002 |
| JP | 2003-344713 A | 12/2003 |
| JP | 2007-58133 A | 3/2007 |
| JP | 2014-215446 A | 11/2014 |
| WO | WO 2016/129505 A1 | 8/2016 |

OTHER PUBLICATIONS

Written Opinion dated May 1, 2018 in PCT/JP2018/005050 filed Feb. 14, 2018.
Combined Chinese Office Action and Search Report dated Sep. 3, 2020 in corresponding Chinese Patent Application No. 201880011370.1 (with English Translation) citing documents AA, AO-AS therein, 13 pages.

* cited by examiner

PACKAGE FOR OPTICAL DEVICE AND OPTICAL DEVICE MODULE

CROSS-REFERENCE TO RELATED APPLICATIONS

This application is a continuation application of International Application No. PCT/JP2018/005050, filed Feb. 14, 2018, which claims the benefit of Japanese Patent Application No. 2017-025249, filed Feb. 14, 2017. The contents of the aforementioned applications are incorporated herein by reference in their entireties.

TECHNICAL FIELD

The present invention relates to a package for an optical device that accommodates an optical device and an optical device module using the same.

BACKGROUND ART

Semiconductor lasers have features such as low power consumption, compact, or the like and are widely used in various fields such as optical communication, optical storage, material processing, or the like. An optical device such as a semiconductor laser is typically accommodated in a package to be modularized for use (Patent Literature 1).

In an optical device module disclosed in Patent Literature 1, in a package accommodating the optical device, a ferrule to which a tip of an optical fiber optically coupled to the optical device is joined is fixed on a stem. An insertion tube is fixed to the package, and the optical fiber is inserted through an optical fiber insertion hole formed of a ring-shaped member inserted into the insertion tube. The insertion tube, the ring-shaped member, and the optical fiber are hermetically sealed and fixed by a low-melting point glass.

CITATION LIST

Patent Literature

Patent Literature 1: Japanese Patent Application Laid-Open No. 2002-258111

SUMMARY OF INVENTION

Technical Problem

In a sealing operation to use a sealing material such as a low-melting point glass as described above to hermetically seal a section through which optical fibers are inserted, it is necessary to heat the periphery of the section through which the optical fibers are inserted by a heater apparatus such as a high frequency heater apparatus. When a low-melting point glass is used as a sealing material, heating at approximately 450 to 550 degrees Celsius is required.

The pipe portion through which an optical fiber is inserted, such as an insertion tube provided to the package, expands due to heating in a sealing operation, and extends in the longitudinal direction. Further, due to a decrease in temperature after the sealing operation is completed, the pipe portion contracts from the extending state to the original state. Due to a phenomenon in which the pipe portion contracts due to a decrease in temperature, the optical fiber sealed with a low-melting point glass near the tip of the pipe portion in a high temperature state is largely bent and curved inside the package. The curvature of an optical fiber in a package is one of the causes of damage on the optical fiber as described below.

With a pipe portion being contracted by a decrease in temperature, an optical fiber is largely bent and curved in a section between a portion aligned and fixed to be optically coupled to an optical device and a portion sealed with a low-melting point glass in the package. As a result, a great lateral shear stress occurs at the roots of both ends of the optical fiber that correspond to the portion that has been aligned and fixed and the portion that has been sealed with a low-melting point glass. At the portion at which a great lateral shear stress of the optical fiber is generated, a large load is applied due to a temperature change or the like caused by various reliability tests after assembly of the optical device module, and as a result, the optical fiber may be damaged. In particular, an optical fiber may be broken at the root of a portion sealed with a low-melting point glass to which a clamping pressure caused by a pipe portion or a low-melting point glass is also applied.

Patent Literature 1 discloses that a natural curvature of the optical fiber caused by a step between the tip of the optical fiber and the hermetically sealed portion is utilized to mitigate a tensile stress and a compressive stress on an optical fiber generated during expansion and contraction of a package due to a change in a peripheral temperature. In the technology disclosed in Patent Literature 1, however, it is considered to be difficult to reduce a lateral shear stress on an optical fiber that is one of the causes of damage on the optical fiber.

In contrast, when a member made of a material having a low thermal expansion coefficient is used as the pipe portion through which an optical fiber is inserted and sealed, even when bending of the optical fiber due to expansion and contraction of the pipe portion can be reduced, no sufficient caulking effect can be obtained at a portion sealed with a low-melting point glass. Without a sufficient caulking effect, it is difficult to ensure a good airtightness for a package.

The present invention intends to provide a package for an optical device and an optical device module that can reduce or prevent damage occurrence in an optical fiber optically coupled to an optical device while ensuring a good airtightness.

Solution to the Problem

According to one aspect of the present invention, provided is a package for an optical device including: a package main unit that accommodates an optical device; a pipe portion that is provided in the package main unit and through which an optical fiber optically coupled to the optical device is inserted; and a fixing portion that is provided in the package main unit and to which one end of the optical fiber is fixed, and the pipe portion includes a first pipe section having a base end fixed to the package main unit; and a second pipe section joined to a tip of the first pipe section, having a higher thermal expansion coefficient than the first pipe section, to be sealed by a sealing material.

According to another aspect of the present invention, provided is an optical device module including: the package for the optical device described above; the optical device accommodated in the package main unit; the optical fiber inserted through the pipe portion and having one end fixed to the fixing portion; and the sealing material sealing the second pipe section through which the optical fiber is inserted.

Advantageous Effects of Invention

According to the present invention, it is possible to reduce or prevent damage occurrence in an optical fiber while ensuring a good airtightness.

DESCRIPTION OF EMBODIMENTS

First Embodiment

A package for an optical device and an optical device module according to one embodiment of the present invention will be described by using FIG. 1 to FIG. 7D.

Figure 1:
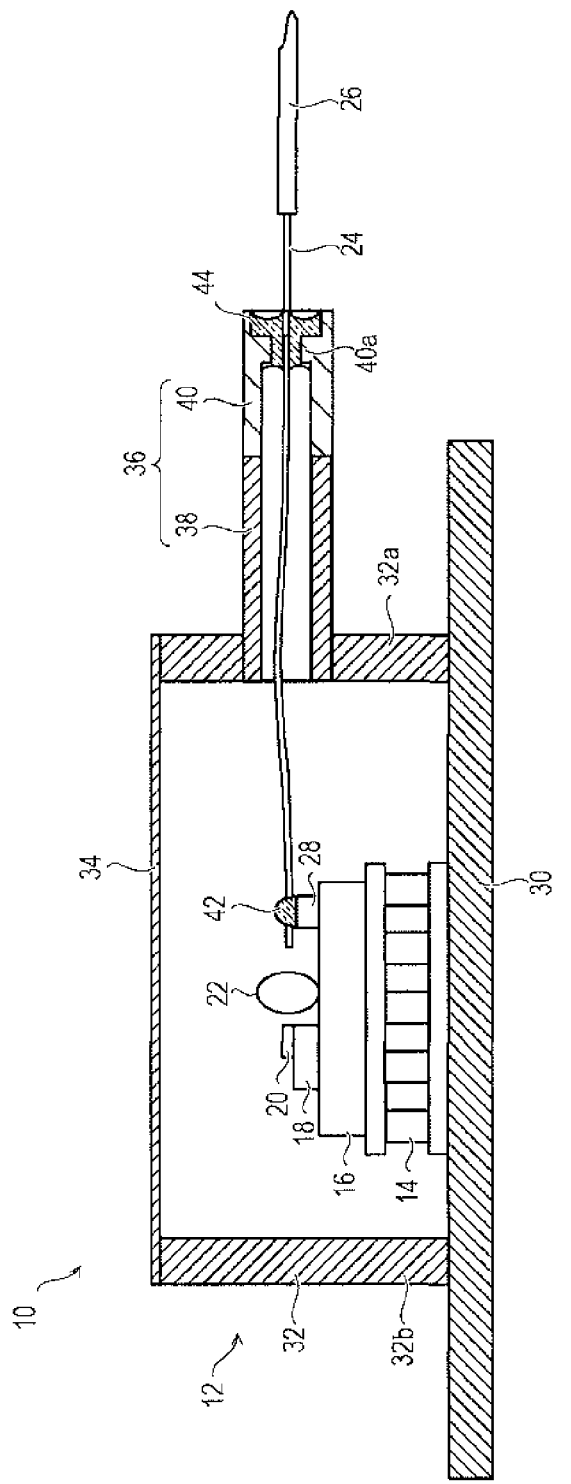
FIG. 1 is a sectional view illustrating an optical device module according to one embodiment of the present invention.
Figure 2:
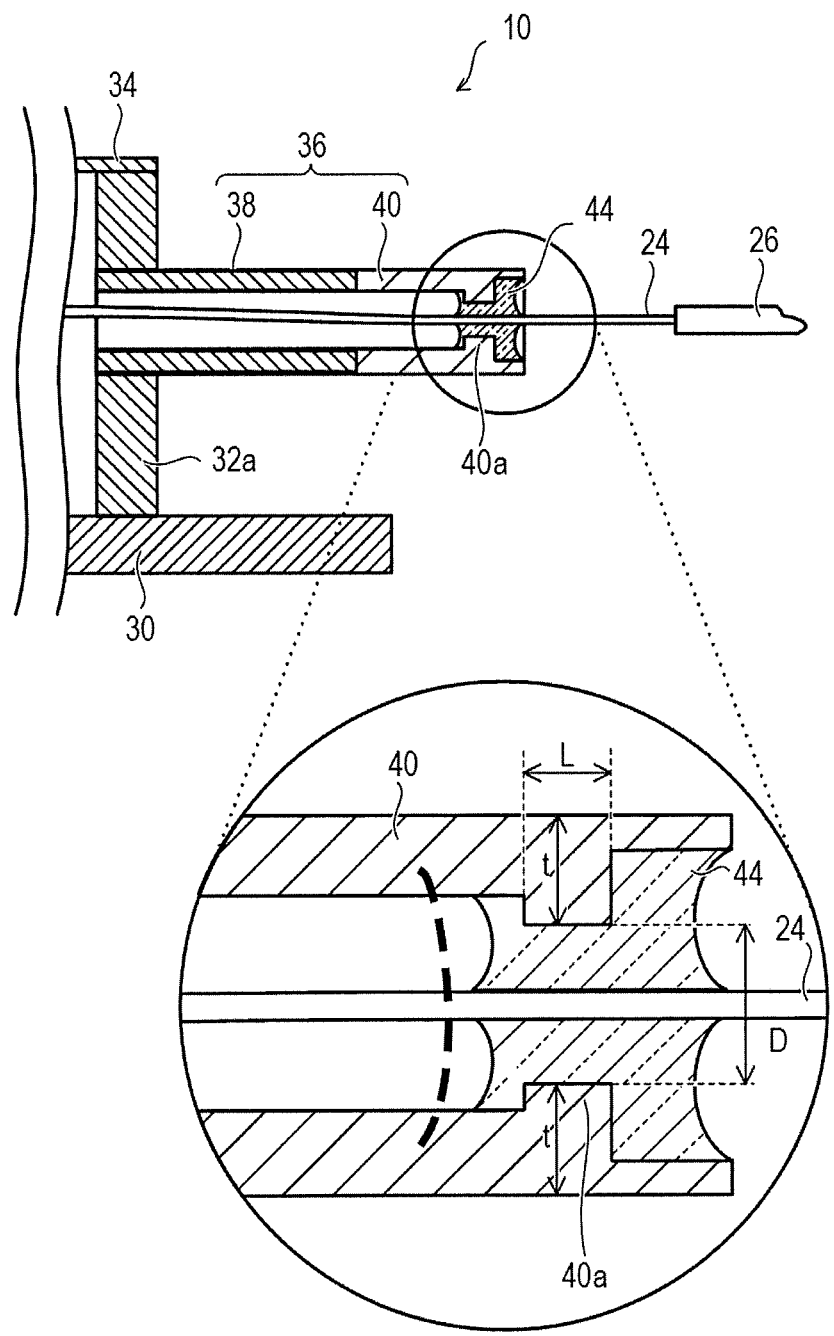
FIG. 2 is sectional views illustrating a pipe portion in a package for an optical device of the optical device module according to one embodiment of the present invention.

First, the configuration of the package for an optical device and the optical device module using the same according to the present embodiment will be described by using FIG. 1 and FIG. 2. FIG. 1 is a sectional view illustrating the optical device module according to the present embodiment. FIG. 2 is a sectional view illustrating a pipe portion in the package for an optical device of the optical device module according to the present embodiment.

The optical device module according to the present embodiment has, as an optical device, a semiconductor laser (laser diode) device that is a type of optical semiconductor devices. As illustrated in FIG. 1, an optical device module 10 according to the present embodiment has a package for an optical device (hereinafter, simply referred to as "package") 12, a cooling device 14, a base 16, a semiconductor laser device 20, a condenser lens 22, an optical fiber 24, and a sealing material 44.

The package 12 forms a container that accommodates the cooling device 14, the base 16, the semiconductor laser device 20, the condenser lens 22, or the like. The package 12 has a bottom plate portion 30, an outer frame portion 32, a lid portion 34, and a pipe portion 36. The cooling device 14, the base 16, the semiconductor laser device 20, the condenser lens 22, and the like are accommodated in a space surrounded by the bottom plate portion 30, the outer frame portion 32, and the lid portion 34. The bottom plate portion 30, the outer frame portion 32, and the lid portion form a package main unit that accommodates the semiconductor laser device 20 or the like.

The cooling device 14 is fixed on the bottom plate portion 30 of the package 12. The bottom plate portion 30 can function as a heatsink. As a material of the bottom plate portion 30, for example, Kovar that is an alloy in which nickel and cobalt are mixed with iron, copper tungsten (CuW) alloy, or the like can be used.

The cooling device 14 may be a thermoelectric cooler (TEC), for example, and can control a temperature of the semiconductor laser device 20. The base 16 is fixed on the cooling device 14. The base 16 is mounted with the semiconductor laser device 20 or the like. As a material of the base 16, for example, a material having a high thermal conductivity and excellent heat dissipation such as aluminum nitride, copper tungsten alloy, copper (Cu), or the like can be used.

The semiconductor laser device 20 that is an optical device is formed in a chip shape. The semiconductor laser device 20 is installed on the base 16, for example, in a form of a chip on submount (COS) on which the semiconductor laser device is fixed and mounted on a submount 18 by soldering or the like. The semiconductor laser device 20 is installed such that the optical axis of the semiconductor laser device 20 is parallel to a direction along the plate surface of the bottom plate portion 30 so as to output a laser light in the direction along the plate surface of the bottom plate portion 30. Note that a lead pin (not illustrated) used for applying a drive current to the semiconductor laser device 20 by an external power supply or the like is provided on the outer frame portion 32 of the package 12, for example. An electrode of the semiconductor laser device 20 is electrically connected to the lead pin by wire bonding, for example.

On the base 16 on the output side of the semiconductor laser device 20, an optical system including the condenser lens 22 or the like that collects a laser light output from the semiconductor laser device 20 is provided. The optical axis of the optical system including the condenser lens 22 or the like matches the optical axis of the semiconductor laser device 20. Note that a collimating lens that collimates a laser light, an optical isolator that blocks a return light, or the like may be provided between the semiconductor laser device 20 and the condenser lens 22 in the optical system. On the base 16 on the output side of the optical system including the condenser lens 22 or the like, a pedestal 28 that is a fixing portion to which the input end of the optical fiber 24 is fixed is provided. As a material of the pedestal 28, for example, ceramic, aluminum nitride, heat resistant glass, or the like can be used. Note that the optical fiber 24 and the semiconductor laser device 20 may be directly, optically coupled without using an optical component such as the condenser lens 22. In such a case, for example, a lensed fiber having a tip that is lens-processed is used as the optical fiber 24, the lens-processed tip of the optical fiber 24 and the semiconductor laser device 20 are directly, optically coupled, and thereby the optical fiber 24 can be fixed to the pedestal 28.

The outer frame portion 32 of the package 12 has a frame member of a rectangular shape and is fixed on the bottom plate portion 30 so as to surround a region including a region in which the semiconductor laser device 20 is installed. The outer frame portion 32 has a front sidewall portion 32a and a rear sidewall portion 32b that face each other in a direction along the optical axis of the semiconductor laser device 20 and a left sidewall portion and a right sidewall portion (both not illustrated) that face each other in a direction orthogonal to the direction along the optical axis of the semiconductor laser device 20. As a material of the outer frame portion 32, for example, Kovar, ceramic, or the like can be used. The outer frame portion 32 is fixed on the bottom plate portion 30, for example, by brazing, soldering, welding, using an adhesive agent, or the like.

The lid portion 34 of the package 12 is fixed on the outer frame portion 32 so as to cover an opening on the upper side of the outer frame portion 32. As a material of the lid portion 34, for example, Kovar or the like can be used. The lid portion 34 is fixed on the outer frame portion 32, for example, by welding, soldering, using an adhesive agent, or the like.

The pipe portion 36 of the package 12 is provided to the front sidewall portion 32a so as to penetrate the front sidewall portion 32a of the outer frame portion 32. The pipe portion 36 is provided in parallel to the direction along the plate surface of the bottom plate portion 30 such that the center axis thereof matches the optical axis of the semiconductor laser device 20. The pipe portion 36 is fixed to the front sidewall portion 32a, for example, by brazing, soldering, welding, using an adhesive agent, or the like.

As illustrated in FIG. 1 and FIG. 2, the pipe portion 36 has a pipe main unit 38 that is a first pipe section and a pipe tip 40 that is a second pipe section. The optical fiber 24 optically coupled to the semiconductor laser device 20 is inserted through the pipe portion 36. The pipe main unit 38 is made of a metal or a ceramic, for example. Further, the pipe tip 40 is made of a metal, for example.

The pipe main unit 38 that is the first pipe section has a base end fixed to the front sidewall portion 32a of the outer frame portion 32. The base end of the pipe main unit 38 is fixed to the front sidewall portion 32a, for example, by brazing, soldering, welding, using an adhesive agent, or the like. A hollow portion of the pipe main unit is connected to a space surrounded by the bottom plate portion 30, the outer frame portion 32, and the lid portion 34.

The pipe tip 40 that is the second pipe section is joined to the tip of the pipe main unit 38 and integrated with the pipe main unit 38. Note that a method for joining the pipe main unit 38 and the pipe tip 40 is not particularly limited, and brazing, laser welding, or the like can also be used. Note that, as the joining method, a method that can ensure the airtightness of the joined portion is preferably used. A hollow portion of the pipe tip 40 is continuously connected with the same diameter to the hollow portion of the pipe main unit 38.

The pipe main unit 38 has a constant inner diameter between the front sidewall portion 32a side and the pipe tip 40 side. The hollow portion of the pipe main unit 38 has a circular cross-sectional shape as a cross-sectional shape orthogonal to the center axis, for example. Note that the cross-sectional shape of the hollow portion of the pipe main unit 38 is not limited to a circular shape, various shapes can be used, and a polygonal shape can also be used.

On the other hand, the pipe tip 40 has a neck portion 40a having the smallest inner diameter in the pipe portion near the tip. That is, the neck portion 40a has a smaller inner diameter than the other sections of the pipe portion 36. In the pipe tip 40, a section of the pipe main unit 38 side of the neck portion 40a has the same inner diameter as the pipe main unit 38, and the pipe main unit 38 and the inner space are continuous each other. In the pipe tip 40, a section of the tip side of the neck portion 40a has the largest inner diameter in the pipe portion 36. The hollow portion of the pipe tip 40 has a circular cross-sectional shape as a cross-sectional shape orthogonal to the center axis, for example, and has different inner diameters in accordance with the position in the center axis direction as described above. Note that the cross-sectional shape of the hollow portion of the pipe tip 40 is not limited to a circular shape, various shapes can be used, and a polygonal shape can also be used.

As described below, each of the pipe main unit 38 and the pipe tip 40 described above is made of different materials having different thermal expansion coefficients. Note that, in the present specification, a thermal expansion coefficient indicates a linear expansion rate in a range from a room temperature to 600 degrees Celsius.

First, the pipe main unit 38 is made of a material having a relatively low thermal expansion coefficient and has a lower thermal expansion coefficient than the pipe tip 40. The thermal expansion coefficient of the pipe main unit is preferably from $4.5 \times 10^{-6}$ to $6.5 \times 10^{-6}$ per degree Celsius. With the thermal expansion coefficient of the pipe main unit 38 within such a numerical range, contraction of the entire pipe portion 36 can be reduced to be small as described below.

A material of the pipe main unit 38 is, for example, Kovar, 42 alloy, ceramic made of alumina or the like, or the like. The thermal expansion coefficient of Kovar is $4.6 \times 10^{-6}$ to $5.5 \times 10^{-6}$ per degree Celsius. The thermal expansion coefficient of 42 alloy is $4.5 \times 10^{-6}$ to $6.5 \times 10^{-6}$ per degree Celsius. The thermal expansion coefficient of ceramic made of alumina is $6.4 \times 10^{-6}$ to $7.5 \times 10^{-6}$ per degree Celsius. Further, as a material of the pipe main unit 38, the same material as the outer frame portion 32 to which the base end of the pipe main unit 38 is fixed can be used.

On the other hand, the pipe tip 40 is made of a material having a relatively high thermal expansion coefficient and has a higher thermal expansion coefficient than the pipe main unit 38. Further, the pipe tip 40 has a higher thermal expansion coefficient than the sealing material 44 made of a low-melting point glass described below. The thermal expansion coefficient of the pipe tip 40 is preferably $7.0 \times 10^{-6}$ to $9.0 \times 10^{-6}$ per degree Celsius. With the thermal expansion coefficient of the pipe tip 40 within such a numeric range, it is possible to obtain a sufficient caulking effect as described below while preventing large deformation due to heat.

As a material of the pipe tip 40, a material having a higher thermal expansion coefficient than the material of the pipe main unit 38 and a low-melting point glass may be appropriately selected for use. The material of the pipe tip 40 is, for example, 42 alloy, 45 alloy, 47 alloy, 50 alloy, 52 alloy, 78 alloy, or the like. The thermal expansion coefficient of 45 alloy is $7.0 \times 10^{-6}$ to $8.0 \times 10^{-6}$ per degree Celsius. The thermal expansion coefficient of 47 alloy is $8.0 \times 10^{-6}$ to $9.0 \times 10^{-6}$ per degree Celsius. The thermal expansion coefficient of 50 alloy is $9.4 \times 10^{-6}$ to $10.4 \times 10^{-6}$ per degree Celsius. The thermal expansion coefficient of 52 alloy is $9.5 \times 10^{-6}$ to $10.5 \times 10^{-6}$ per degree Celsius. The thermal expansion coefficient of 78 alloy is $13.5 \times 10^{-6}$ to $14.5 \times 10^{-6}$ per degree Celsius.

One end of the optical fiber 24 is inserted through the pipe portion 36 and introduced into the package 12. The one end side of the optical fiber 24 introduced into the package including the pipe portion 36 is in a state of a bare fiber from which a cover 26 is removed.

The one end of the optical fiber 24 introduced into the package 12 is the input end to which the laser light is input, adjusted to match the optical axis of the semiconductor laser device 20, and fixed on the pedestal 28 by a fixing material 42. As the fixing material 42, for example, resin, solder, low-melting point glass, or the like can be used. A laser light output from the semiconductor laser device 20 and collected by the condenser lens 22 is input to the one end of the optical fiber 24 fixed on the pedestal 28 that is a fixing portion. In such a way, the semiconductor laser device 20 is optically coupled to the one end of the optical fiber 24 via an optical system including the condenser lens 22 or the like. The laser light input to the one end of the optical fiber 24 propagates through the optical fiber 24 and is then output from the other end of the optical fiber 24 that is the output end.

In the pipe portion 36 through which the optical fiber is inserted, the pipe tip 40 is hermetically sealed by the sealing material 44 made of a low-melting point glass. More specifically, at the pipe tip 40 of the pipe portion 36, the neck portion 40a through which the optical fiber 24 is inserted is hermetically sealed by the sealing material 44 made of a low-melting point glass. The sealing material 44 closes and hermetically seals a hollow portion of the neck portion 40a and a hollow portion of the adjacent section thereof in the pipe tip 40 together with the optical fiber 24. The optical fiber 24 is fixed by the sealing material 44 so as to be located at the center of the neck portion 40a.

Note that a low-melting point glass forming the sealing material 44 is a glass having a softening point lower than or equal to 600 degrees Celsius and may be any material as long as it softens at the heating temperature in the sealing operation. The low-melting point glass is preferably a glass having a softening point lower than or equal to 500 degrees Celsius and more preferably a glass having a softening point lower than or equal to 400 degrees Celsius. The thermal expansion coefficient of the low-melting point glass forming the sealing material 44 is $5.9 \times 10^{-6}$ to $12 \times 10^{-6}$ per degree Celsius, for example. The type of low-melting point glass forming the sealing material 44 is not particularly limited, and a low-melting point glass of lead-based, vanadium-based, bismuth-based, or the like can be used, for example. Note that, in terms of environmental compatibility, a lead-free low-melting point glass such as a vanadium-based glass or the like is preferable.

As illustrated in FIG. 2, at the neck portion 40a hermetically sealed by the sealing material 44 as described above, an inner diameter D is larger than a length L in the center axis direction. That is, the hollow portion of the neck portion 40a has a shape that is wider in the radial direction. The length L of the neck portion 40a in the center axis direction is, for example, 0.3 to 0.8 mm. On the other hand, the inner diameter D of the neck portion 40a is, for example, 0.5 to 1.0 mm.

The optical fiber 24 fixed on the pedestal 28 and by the neck portion 40a is slightly bent and fixed along the direction of the optical axis of the semiconductor laser device 20.

The optical fiber 24 fixed between the pedestal 28 and the neck portion 40a inside the package 12 is not in contact with the inner wall of the package 12, that is, the inner wall surface of the pipe portion 36, the inner wall surface of the outer frame portion 32, the bottom surface of the bottom plate portion 30, and the ceiling surface of the lid portion 34.

As described above, the optical device module 10 according to the present embodiment is formed.

In the operation of the optical device module 10 according to the present embodiment, a drive current is applied to the semiconductor laser device 20 by an external drive power source. In response to the drive current being applied, the semiconductor laser device 20 oscillates laser and outputs a laser light. The laser light output from the semiconductor laser device 20 is collected by the condenser lens 22 and enters the fixed end fixed on the pedestal 28 of the optical fiber 24. The laser light entering the fixed end of the optical fiber 24 is output from the output end of the optical fiber 24 as output of the optical device module 10.

In the optical device module 10 according to the present embodiment, the pipe portion 36 through which the optical fiber 24 is inserted and hermetically sealed has the pipe main unit 38 and the pipe tip 40 as described above. The pipe tip 40 has a higher thermal expansion coefficient than the sealing material 44 formed of the pipe main unit 38 and a low-melting point glass. In such a way, in the present embodiment, the pipe portion 36 is divided into the pipe tip 40 and the pipe main unit 38 having thermal expansion coefficients that are different from each other. This can reduce or prevent damage occurrence in the optical fiber 24 optically coupled to the semiconductor laser device while ensuring a good airtightness for the package 12 accommodating the semiconductor laser device 20. This will be described below in detail.

Figure 4:
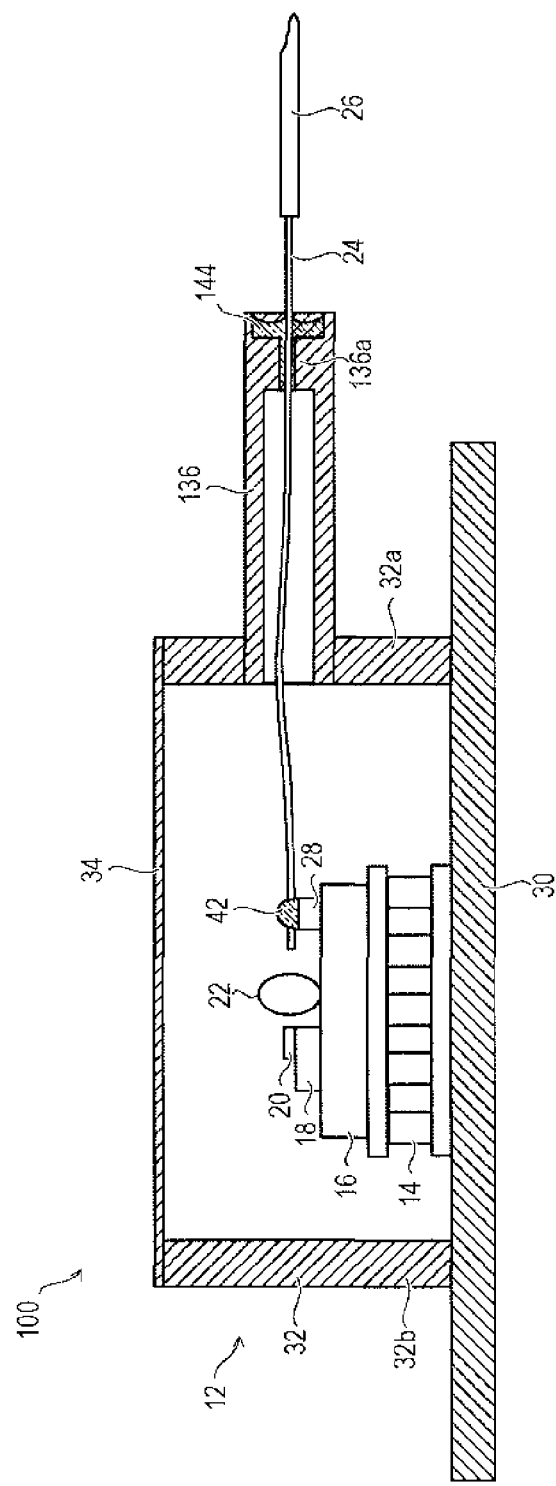
FIG. 4 is a sectional view illustrating an optical device module according to a background art.

As the pipe portion for introducing the optical fiber 24 inside the package 12, unlike the present embodiment, an undivided pipe portion made of a material having a relatively low thermal expansion coefficient, for example, only Kovar may be used in the same manner as the outer frame portion 32 or the lid portion 34. FIG. 4 is a sectional view illustrating an optical device module according to a background art in which an undivided pipe portion made of only Kovar is used.

As illustrated in FIG. 4, in an optical device module 100 according to the background art, an undivided pipe portion 136 made of only Kovar is provided in the front sidewall portion 32a of the outer frame portion 32 instead of the pipe portion 36 divided into two according to the present embodiment. The pipe portion 136 has a neck portion 136a having the smallest inner diameter in the pipe portion 136 near the tip. A hollow portion of the neck portion 136a through which the optical fiber 24 is inserted is hermetically sealed by a sealing material 144 made of a low-melting point glass. The features of the optical device module 100 other than the above are the same as those of the optical device module 10 illustrated in FIG. 1.

In the optical device module 100 according to the background art, the thermal expansion coefficient of the entire pipe portion 136 is relatively low and is lower than that of the sealing material 144 made of a low-melting point glass. In this case, when the pipe portion 136 contracts due to a decrease in temperature after the heating in the sealing operation, it is not possible to obtain a sufficient caulking effect by which the pipe portion 136 clamps the sealing material 144 made of a low-melting point glass and the optical fiber 24 at the neck portion 136a. As a result, it is difficult to ensure a good airtightness at the neck portion 136a sealed by the sealing material 144. Specifically, the optical device module 100 according to the background art illustrated in FIG. 4 causes a defective product with a poor airtightness at a leak amount level of $10^{-7}$ to $10^{-9}$ Pa·m³/s measured by a helium leak test, for example.

Figure 5:
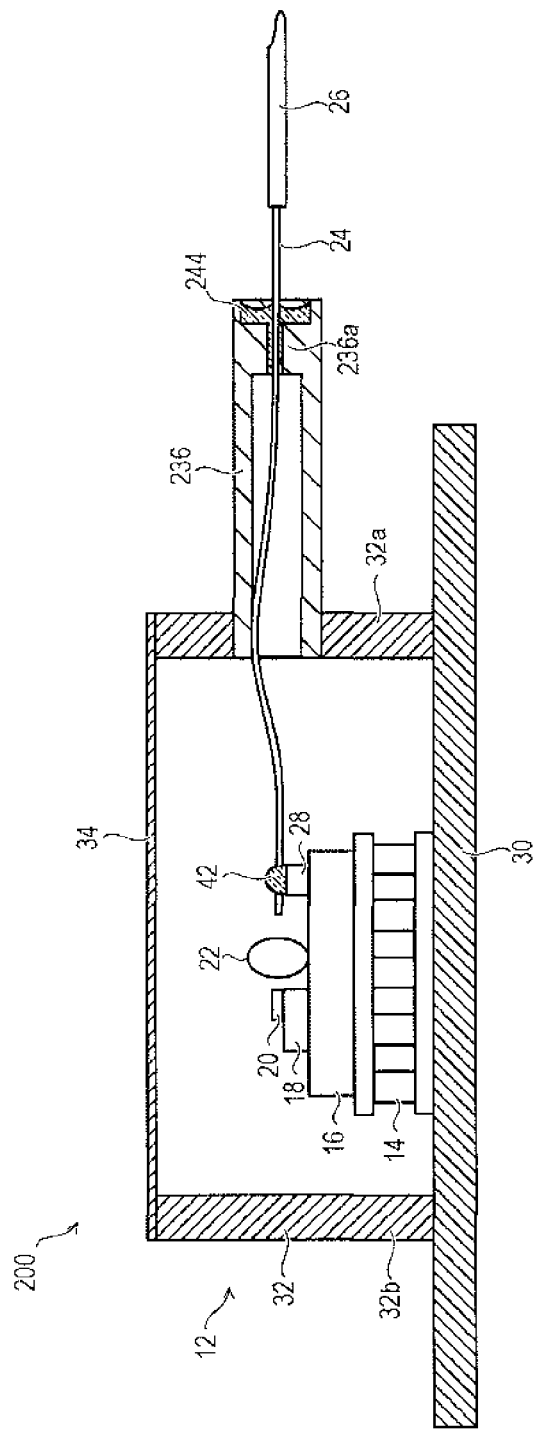
FIG. 5 is a sectional view illustrating an optical device module according to another background art.

Further, as a pipe portion for introducing the optical fiber 24 inside the package 12, unlike the present embodiment, an undivided pipe portion made of a material having a relatively high thermal expansion coefficient, for example, a use of only 50 alloy may be considered in order to obtain the caulking effect described above. FIG. 5 is a sectional view illustrating an optical device module according to another background art in which an undivided pipe portion made of only 50 alloy is used.

As illustrated in FIG. 5, in an optical device module 200 according to another background art, an undivided pipe portion 236 made of only 50 alloy is provided in the front sidewall portion 32a of the outer frame portion 32 instead of the pipe portion 36 divided into two according to the present embodiment. The pipe portion 236 has a neck portion 236a having the smallest inner diameter in the pipe portion 236 near the tip thereof. A hollow portion of the neck portion 236a through which the optical fiber 24 is inserted is hermetically sealed by a sealing material 244 made of a low-melting point glass. The features of the optical device module 200 other than the above are the same as those of the optical device module 10 illustrated in FIG. 1.

In the optical device module 200 according to another background art, the thermal expansion coefficient of the entire pipe portion 236 is relatively high and is higher than that of the sealing material 244 made of a low-melting point glass. In this case, when the pipe portion 236 contracts due to a decrease in temperature after the heating in the sealing operation, it is possible to obtain a sufficient caulking effect by which the pipe portion 236 clamps the sealing material 244 made of a low-melting point glass and the optical fiber 24 at the neck portion 236a. As a result, it is possible to ensure a good airtightness at the neck portion 236a sealed by the sealing material 244. Specifically, in the optical device module 200 according to another background art illustrated in FIG. 5, for example, a good airtightness at a leak amount level of $10^{-11}$ Pa·m³/s measured by the helium leak test can be ensured.

On the other hand, in the optical device module 200 according to another background art, the pipe portion 236 largely expands due to the heating in the sealing operation. Further, when the pipe portion 236 contracts due to a decrease in temperature after the heating, the pipe portion 236 largely contracts because of the relatively high thermal expansion coefficient. As a result, the optical fiber 24 fixed by the pedestal 28 and the neck portion 236a is largely bent and curved to come into contact with the inner wall of the pipe portion 236. With the optical fiber 24 being largely bent and curved, a great lateral shear stress, which is one of the causes of the damage on the optical fiber 24, is generated at the roots of both ends of the optical fiber 24, which correspond to the portion where the optical fiber 24 is aligned and fixed and the portion where the optical fiber 24 is sealed with a low-melting point glass as described above. Therefore, in the optical device module 200 according to another background art illustrated in FIG. 5, damage on the optical fiber 24 such as a breakage failure of the optical fiber 24 often occurs, and it is difficult to reduce damage on the optical fiber 24.

In contrast, in the optical device module 10 according to the present embodiment, in the pipe portion 36, the pipe tip 40 including the hermetically sealed neck portion 40a has a higher thermal expansion coefficient than the pipe main unit 38 and the sealing material 44 made of a low-melting point glass. Due to the relatively high thermal expansion coefficient of the pipe tip 40, it is possible to obtain a sufficient caulking effect by which the pipe tip 40 clamps the sealing material 44 made of a low-melting point glass and the optical fiber 24 at the neck portion 40a. Therefore, a good airtightness can be ensured in the optical device module 10 according to the present embodiment. In the optical device module 10 according to the present embodiment, for example, a good airtightness at a leak amount level of $10^{-11}$ Pa·m³/s measured by the helium leak test can be ensured.

Further, in the optical device module 10 according to the present embodiment, the thermal expansion coefficient of the pipe main unit 38 is relatively low and is lower than the thermal expansion coefficient of the pipe tip 40. Therefore, the expansion of the pipe main unit 38 due to the heating in the sealing operation is reduced to be small. Furthermore, when the pipe main unit 38 contracts due to a decrease in temperature after the heating, the contraction of the pipe main unit 38 is reduced to be small. In such a way, expansion and contraction of the entire pipe portion 36 is also reduced to be small. As a result, bending of the optical fiber 24 fixed by the pedestal 28 and the neck portion 40a can be reduced to be small. According to the present embodiment, it is possible to prevent the optical fiber 24 inside the pipe portion 36 from bending and coming into contact with the inner wall of the pipe portion 36. Therefore, in the optical device module 10 according to the present embodiment, the generation of a lateral shear stress in the optical fiber 24 inside the package 12 can be reduced, and thereby occurrence of damage on the optical fiber 24 such as a breakage failure can be reduced or prevented.

In such a way, in the optical device module 10 according to the present embodiment, by sealing the neck portion 40a with a good airtightness, it is possible to ensure a good airtightness for the package 12 accommodating the semiconductor laser device 20. Further, in the optical device module 10 according to the present embodiment, by reducing generation of a lateral shear stress in the optical fiber 24 inside the package 12, it is possible to reduce or prevent damage occurrence in the optical fiber 24 such as a breakage failure.

Further, in the optical device module 10 according to the present embodiment, at the neck portion 40a hermetically sealed by the sealing material 44, the inner diameter D is larger than the length L in the center axis direction. Thereby, a load on the optical fiber 24 at the neck portion 40a can be reduced. This will be described below in detail.

Figure 6:
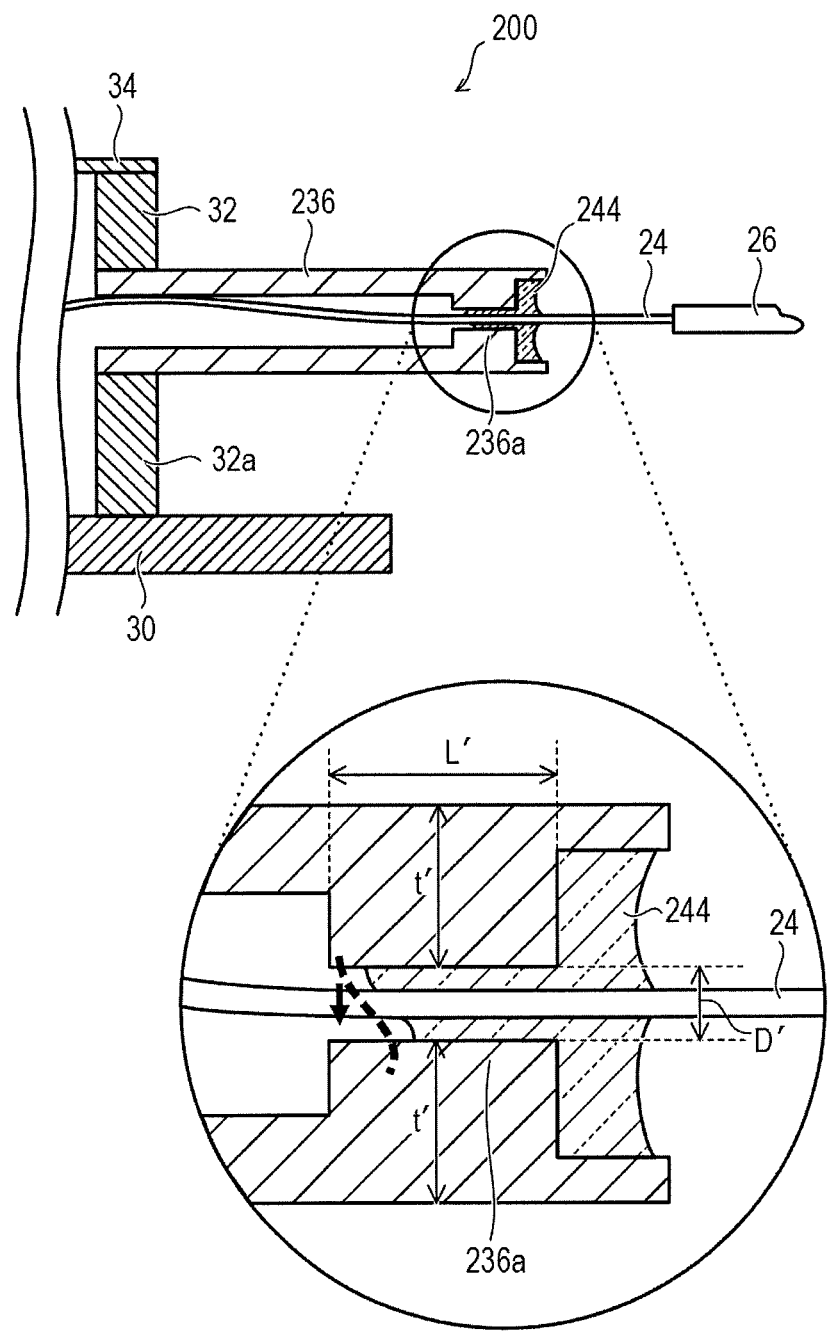
FIG. 6 is a sectional view illustrating a pipe portion in the optical device module according to another background art.

In the optical device module 200 according to another background art, at the neck portion 236a hermetically sealed, a length L' in the center axis direction is longer than an inner diameter D' as illustrated in FIG. 6. In such a case where the hollow portion of the neck portion 236a is elongated in the center axis direction thereof, when the viscosity of a low-melting point glass forming the sealing material 244 is high, the sealing material 244 cannot sufficiently enter the hollow portion of the neck portion 236a. Therefore, the filling of the sealing material 244 at the neck portion 236a becomes insufficient. In this case, an unbalanced slope occurs at the inner end of the sealing material 244, and as a result, a biased stress is applied to the optical fiber 24.

Further, since the inner diameter D' is smaller than the length L', a thickness t' of a metal material forming the neck portion 236a is relatively thicker at the neck portion 236a.

This causes a pressure that clamps the optical fiber 24 by the contraction at the neck portion 236a, and a large load is applied to the optical fiber.

Therefore, with the neck portion 236a having a shape elongated in the center axis direction as illustrated in FIG. 6, damage of the optical fiber 24 is likely to occur.

On the other hand, in the optical device module 10 according to the present embodiment, at the neck portion 40a hermetically sealed, the inner diameter D is larger than the length L in the center axis direction as illustrated in FIG. 2. In such a case where the hollow portion of the neck portion 40a is wider in the radial direction, even when the viscosity of a low-melting point glass forming the sealing material 44 is high, the sealing material 44 can sufficiently enter the hollow portion of the neck portion 40a. Therefore, the filling of the sealing material 44 at the neck portion 40a is sufficient, and the inner end of the sealing material 44 filled in and near the neck portion 40a can be formed in a well-balanced shape. This enables an even stress applied to the optical fiber 24 at the neck portion 40a.

Further, due to the inner diameter D being larger than the length L, a thickness t of a metal material forming the neck portion 40a is relatively thinner at the neck portion 40a. This causes an appropriate level of the pressure to clamp the optical fiber 24 by the contraction at the neck portion 40a, and a load applied to the optical fiber 24 can be reduced.

In such a way, in the optical device module 10 according to the present embodiment, since the inner diameter D is larger than the length L in the center axis direction, an even stress can be allowed, and the load can be reduced. It is therefore possible to reduce or prevent damage occurrence in the optical fiber 24 more reliably.

Next, a sealing operation of the optical device module 10 according to the present embodiment will be described by using FIG. 3A to FIG. 3D. FIG. 3A to FIG. 3D are process sectional views illustrating the sealing operation of the optical device module 10 according to the present embodiment.

First, the package 12 of the optical device module 10 on which the sealing operation is performed is fixed to a fixing jig 50. The bottom plate portion 30 of the package is vertically fixed to the fixing jig 50 such that the pipe portion 36 faces upward such that the center axis thereof is vertical. In the package 12 fixed to the fixing jig 50, the lid portion 34 is not fixed to the outer frame portion 32, and the upper side of the bottom plate portion 30 including the semiconductor laser device 20 or the like installed on the bottom plate portion 30 is open. Further, one end side of the optical fiber 24 in a state of a bare fiber from which a cover 26 has been removed is inserted through the pipe portion 36. One end of the optical fiber introduced into the package 12 is aligned so as to be optically coupled to the optical axis of the semiconductor laser device 20 and fixed to the pedestal 28 by the fixing material 42 made of a resin or the like.

Figure 3A:
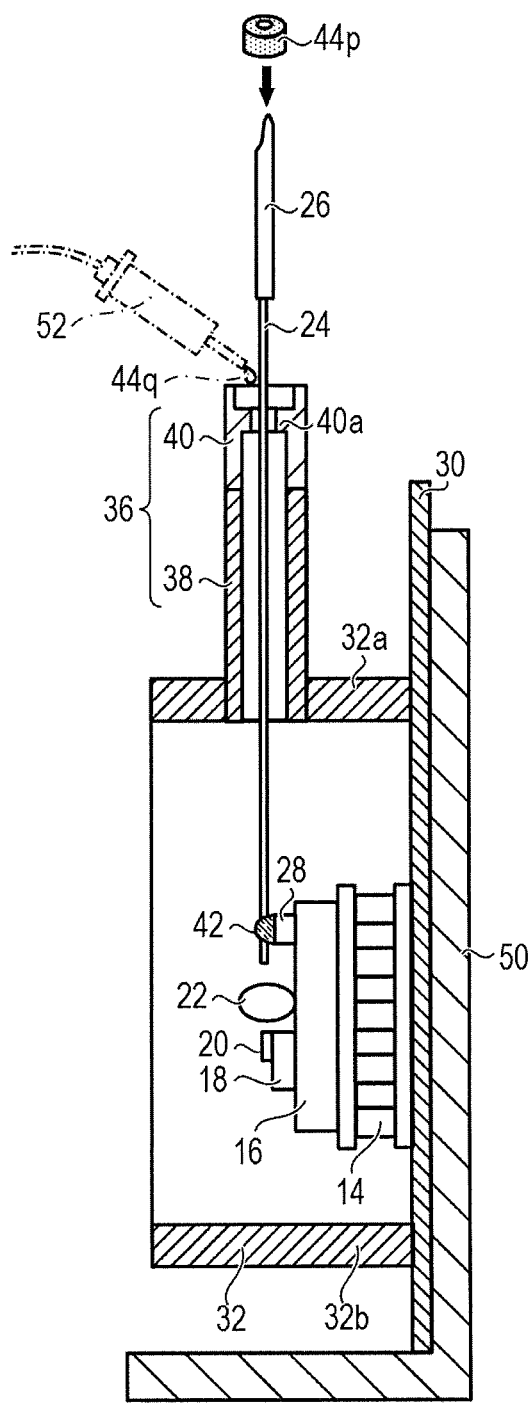
FIG. 3A is a process sectional view illustrating a sealing operation of the optical device module according to one embodiment of the present invention.

Subsequently, as illustrated in FIG. 3A, a low-melting point glass pellet 44p used as the sealing material 44 is arranged at the tip opening of the pipe tip 40 in the pipe portion 36 through which the optical fiber 24 is inserted. The low-melting point glass pellet 44p is, for example, a cylindrical solid material having an inner diameter larger than the outer diameter of the optical fiber 24 and an outer diameter larger than the inner diameter of the neck portion 40a and smaller than the outer diameter of the pipe tip 40. In this case, the low-melting point glass pellet 44p can be arranged in the tip opening of the pipe tip 40 with the optical fiber 24 being inserted through a hollow portion thereof.

Note that the low-melting point glass used as the sealing material 44 can also be supplied to the tip opening of the pipe tip 40 in a form of a paste instead of being arranged to the tip opening of the pipe tip 40 in a form of a pellet such as the low-melting point glass pellet 44p. In this case, as illustrated in FIG. 3A, a low-melting point glass paste 44q used as the sealing material 44 can be ejected by a dispenser 52 and supplied to the tip opening of the pipe tip 40, for example.

Figure 3B:
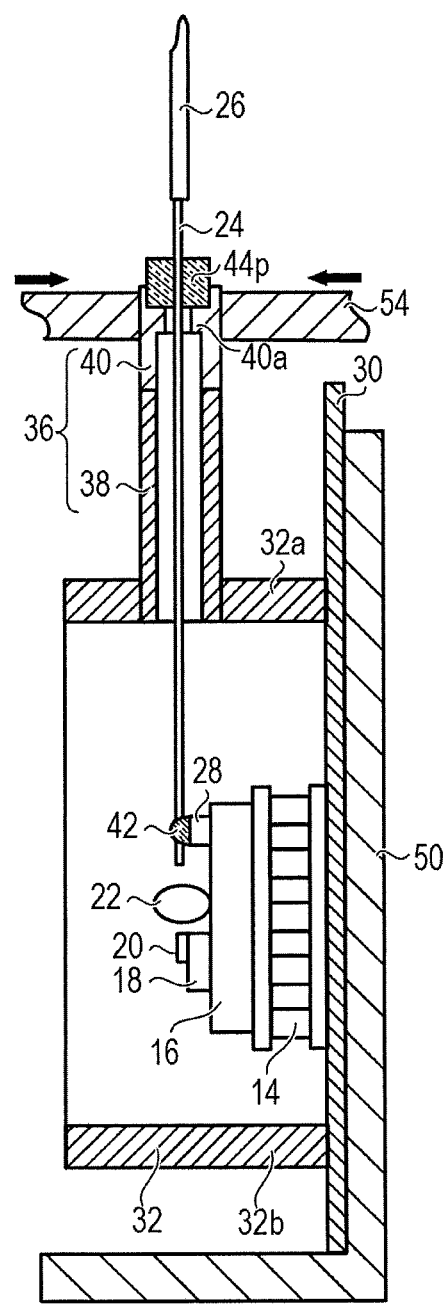
FIG. 3B is a process sectional view illustrating the sealing operation of the optical device module according to one embodiment of the present invention.

Subsequently, as illustrated in FIG. 3B, a heater 54 is brought into contact with the pipe tip 40 that is the tip of the pipe portion 36, and the pipe portion 36 is heated by the heater 54. At this time, the optical fiber 24 is held such that the optical fiber 24 has no bending of the optical fiber 24 or no misalignment of the center position to the hole of the pipe tip 40 in the package 12. Further, a heating temperature by the heater 54 can be set to, for example, a temperature of 450 to 500 degrees Celsius in accordance with melting and liquefaction of the low-melting point glass and can be set to, preferably, a temperature of 460 to 480 degrees Celsius.

Figure 3C:
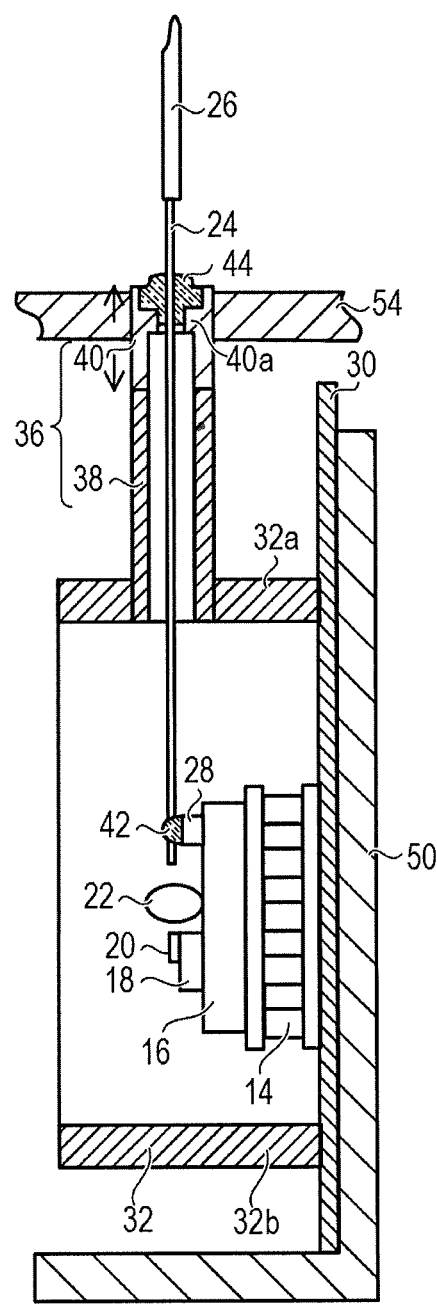
FIG. 3C is a process sectional view illustrating the sealing operation of the optical device module according to one embodiment of the present invention.

Once the pipe portion 36 is heated, the low-melting point glass pellet 44p heated accordingly is melted and liquefied, and this flows into the hollow portion in and near the neck portion 40a of the pipe tip 40 as the sealing material 44 as illustrated in FIG. 3C. In the present embodiment, as described above, the inner diameter D is larger than the length L in the center axis direction at the neck portion 40a. Therefore, the sealing material 44 can sufficiently enter the hollow portion of the neck portion 40a, and thereby the filling of the sealing material 44 at the neck portion 40a is sufficiently obtained.

Heating by the heater 54 causes thermal expansion in the pipe portion 36. In the present embodiment, as described above, the pipe tip 40 has a higher thermal expansion coefficient than the pipe main unit 38, the thermal expansion coefficient of the pipe tip 40 is relatively high, and the thermal expansion coefficient of the pipe main unit 38 is relatively low. Therefore, an extension in the center axis direction due to the thermal expansion of the pipe portion 36 is generated mainly at the pipe tip 40 as illustrated with arrows in FIG. 3C. Therefore, in the present embodiment, compared to a case of another background art illustrated in FIG. 7C described below, extension in the center axis direction due to thermal expansion of the pipe portion 36 can be reduced to be small as a whole.

Figure 3D:
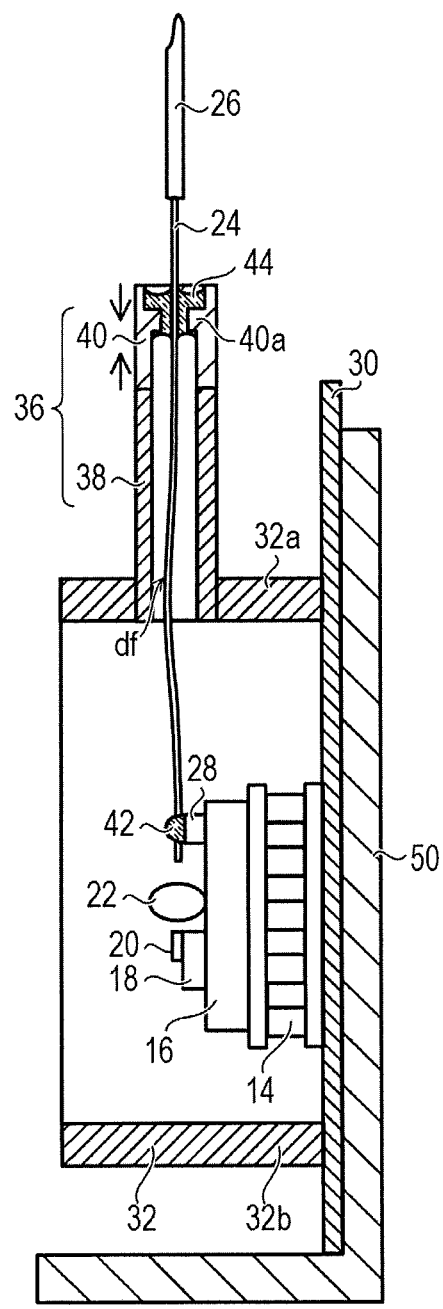
FIG. 3D is a process sectional view illustrating the sealing operation of the optical device module according to one embodiment of the present invention.

Subsequently, as illustrated in FIG. 3D, the heater 54 is separated from the tip of the pipe portion 36 to cool the pipe portion 36. The cooling method is not particularly limited and may be natural cooling or forced cooling by blowing or the like. Once the pipe portion 36 is cooled, the sealing material 44 filled in and near the neck portion 40a is solidified at the pipe tip 40. In such a way, the optical fiber 24 is fixed at the neck portion 40a by the sealing material 44, and the neck portion 40a through which the optical fiber 24 is inserted is hermetically sealed by the sealing material 44.

After the hollow portion of the neck portion 40a is sealed as described above, the lid portion 34 is fixed on the outer frame portion 32.

In the present embodiment, as described above, the pipe tip 40 has a higher thermal expansion coefficient than the sealing material 44 made of a low-melting point glass. It is therefore possible to obtain a sufficient caulking effect that the pipe tip 40 clamps the sealing material 44 made of a low-melting point glass and the optical fiber 24 at the neck portion 40a. Therefore, in the present embodiment, a good airtightness can be ensured.

Further, in the present embodiment, as described above, the pipe tip 40 has a higher thermal expansion coefficient than the pipe main unit 38, the thermal expansion coefficient of the pipe tip 40 is relatively high, and the thermal expansion coefficient of the pipe main unit 38 is relatively low. Therefore, contraction in the center axis direction due to the cooling of the pipe portion 36 is generated mainly at the pipe tip 40 as illustrated with arrows in FIG. 3D. Therefore, in the present embodiment, compared to the case illustrated in FIG. 7D described below, contraction in the center axis direction due to the cooling of the pipe portion 36 can be reduced to be small as a whole.

In the present embodiment, by reducing extension due to thermal expansion and contraction due to cooling of the pipe portion 36 to be small as described above, it is possible to reduce bending df of the optical fiber 24 fixed by the pedestal 28 and the neck portion 40a to be small. According to the present embodiment, it is possible to prevent the optical fiber 24 inside the pipe portion 36 from bending and coming into contact with the inner wall of the pipe portion 36. Therefore, in the optical device module 10 according to the present embodiment, the generation of a lateral shear stress in the optical fiber 24 inside the package 12 can be reduced, and thereby occurrence of damage on the optical fiber 24 such as a breakage failure can be reduced or prevented.

Further, in the present embodiment, a change in the fiber coupled light output (Pf) and a change in the polarization extinction ratio (PER) before and after sealing of the neck portion 40a can be reduced to be small, and stable characteristics can be obtained.

On the other hand, as described above, in the optical device module 200 according to another background art illustrated in FIG. 5, it is difficult to achieve both ensuring a good airtightness and reducing damage occurrence in the optical fiber 24. A sealing operation of the optical device module 200 according to another background art will be described below by using FIG. 7A to FIG. 7D. FIG. 7A to FIG. 7D are process sectional views illustrating the sealing operation of the optical device module 200 according to another background art.

Figure 7A:
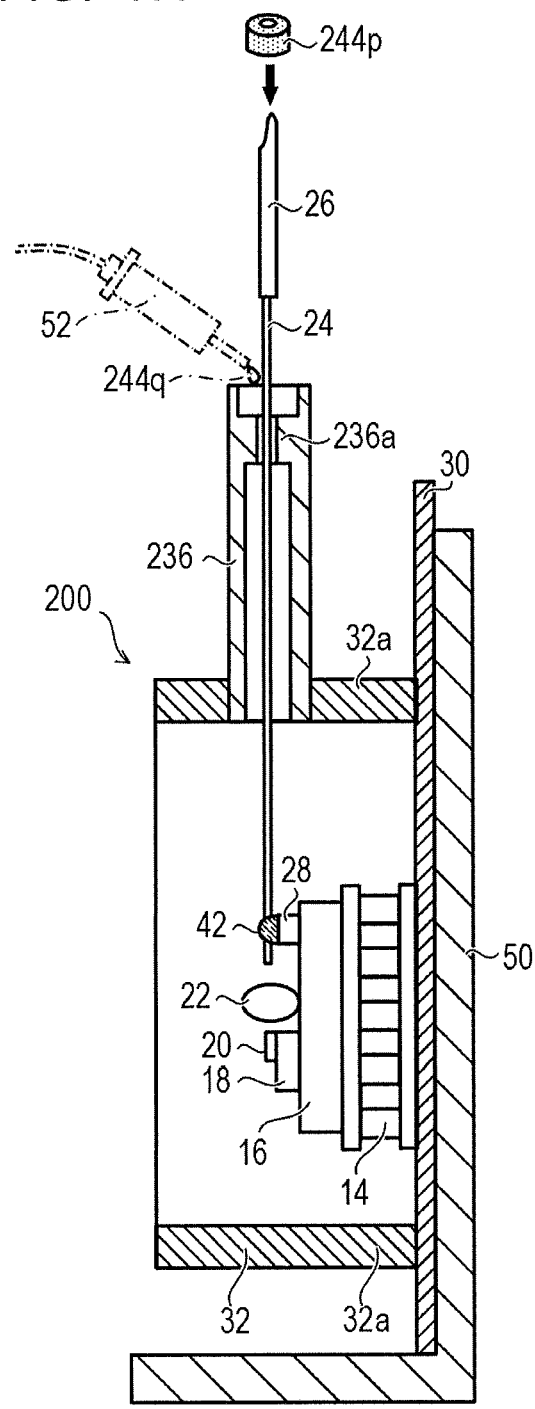
FIG. 7A is a process sectional view illustrating a sealing operation of the optical device module according to another background art.

First, as illustrated in FIG. 7A, in the same manner as the case illustrated in FIG. 3A, a low-melting point glass pellet 244p, which is similar to the low-melting point glass pellet 44p, is arranged at the tip opening of the pipe portion 236 through which the optical fiber 24 is inserted. Note that, in the same manner as the case illustrated in FIG. 3A to FIG. 3D, a low-melting point glass paste 244q, which is similar to the low-melting point glass paste 44q, can be ejected by the dispenser 52 and supplied to the tip opening of the pipe portion 236.

Figure 7B:
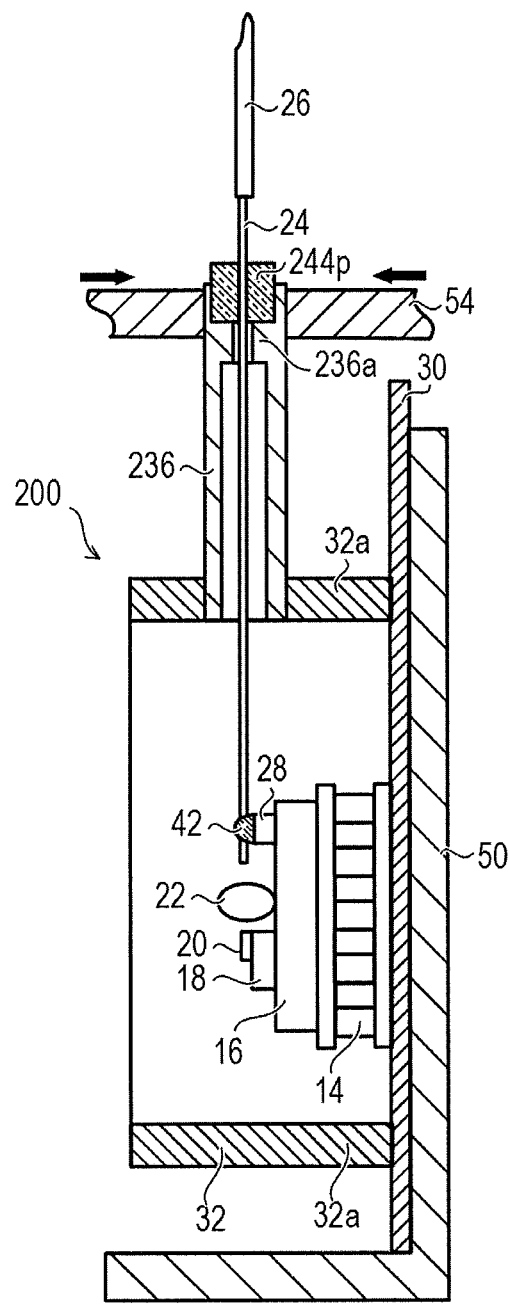
FIG. 7B is a process sectional view illustrating the sealing operation of the optical device module according to another background art.
Figure 7C:
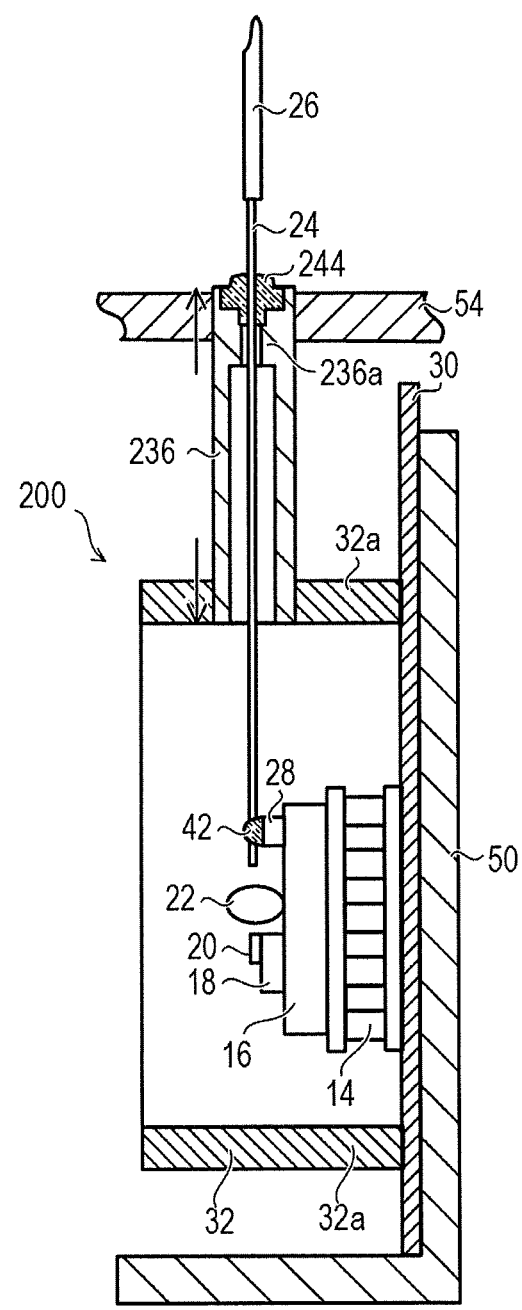
FIG. 7C is a process sectional view illustrating the sealing operation of the optical device module according to another background art.

Subsequently, as illustrated in FIG. 7B, in the same manner as the case illustrated in FIG. 3B, the heater 54 is brought into contact with the tip of the pipe portion 236, and the pipe portion 236 is heated by the heater 54. Once the pipe portion 236 is heated, the low-melting point glass pellet 244p heated accordingly is melted and liquefied as illustrated in FIG. 7C and enters a hollow portion of the neck portion 236a of the pipe portion 236 as the sealing material 244.

Heating by the heater 54 causes thermal expansion to the pipe portion 236. Unlike the present embodiment, in another background art, the thermal expansion coefficient of the entire pipe portion 236 is relatively high as described above. Therefore, extension in the center axis direction due to the thermal expansion of the pipe portion 236 occurs in the entire pipe portion 236 as illustrated with arrows in FIG. 7C.

Therefore, in another background art, compared to the case of the present embodiment illustrated in FIG. 3C described above, extension in the center axis direction due to the thermal expansion of the pipe portion 236 increases.

Figure 7D:
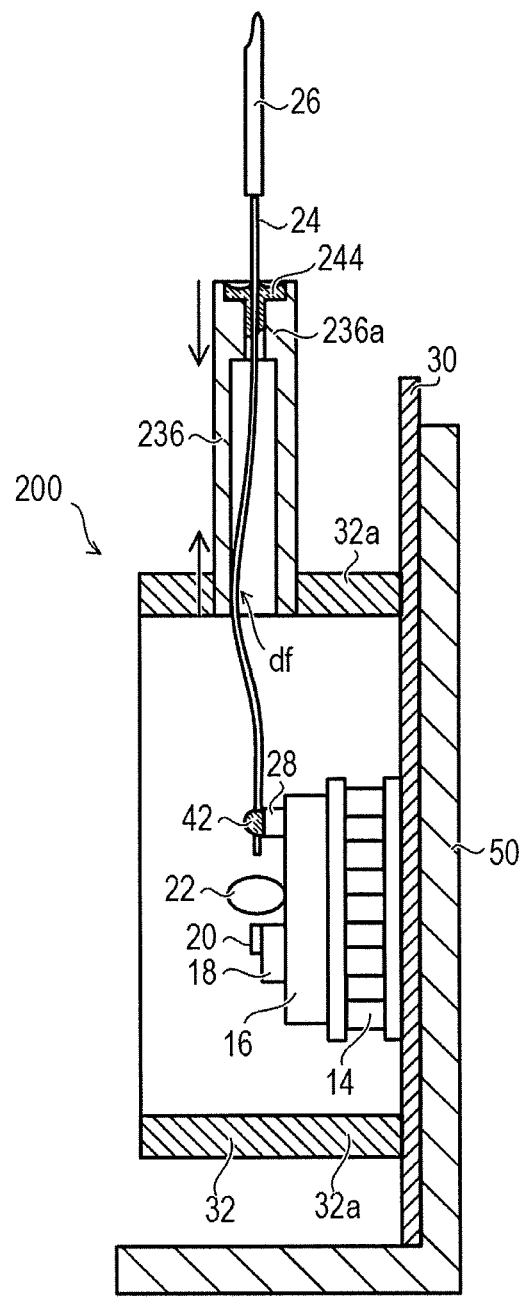
FIG. 7D is a process sectional view illustrating the sealing operation of the optical device module according to another background art.

Subsequently, as illustrated in FIG. 7D, in the same manner as the case illustrated in FIG. 3D, the heater 54 is separated from the tip of the pipe portion 236 to cool the pipe portion 236. Once the pipe portion 236 is cooled, the sealing material 244 filled in the neck portion 236a is solidified in the pipe portion 236. In such a way, the optical fiber 24 is fixed to the neck portion 236a by the sealing material 244, and the neck portion 236a through which the optical fiber 24 is inserted is hermetically sealed by the sealing material 244.

Unlike the present embodiment, in another background art, the thermal expansion coefficient of the entire pipe portion 236 is relatively high as described above. Therefore, contraction in the center axis direction due to the cooling of the pipe portion 236 occurs in the entire pipe portion 236 as illustrated with arrows in FIG. 7D. Therefore, in another background art, compared to the case of the present embodiment illustrated in FIG. 3D described above, contraction in the center axis direction due to the cooling of the pipe portion 236 increases.

In another background art, since extension due to thermal expansion and contraction due to cooling of the pipe portion 36 increase as described above, the bending df of the optical fiber 24 fixed by the pedestal 28 and the neck portion 236a will increase. As a result, in another background art, it is difficult to reduce occurrence of a lateral shear stress in the optical fiber 24 inside the package 12, and it is difficult to reduce damage occurrence in the optical fiber 24.

As described above, according to the present embodiment, it is possible to reduce or prevent damage occurrence in the optical fiber 24 optically coupled to the semiconductor laser device 20 while ensuring a good airtightness for the package 12 accommodating the semiconductor laser device 20.

Modified Embodiment

The present invention is not limited to the embodiment described above, and various modifications are possible.

For example, while the case where the semiconductor laser device 20 is accommodated in the package 12 has been described as an example in the above embodiments, the invention is not limited thereto. As an optical device, instead of the semiconductor laser device 20, a light emitting device such as a light emitting diode can be used, or a light receiving device such as a photodiode can be used.

Further, while the case where a material made of a low-melting point glass is used as the sealing material 44 has been described as an example in the above embodiments, the invention is not limited thereto. As the sealing material 44, a material made of solder, resin, or the like can also be used instead of a material made of a low-melting point glass. Note that, when the sealing material 44 made of solder is used, a metallized fiber in which at least one end sealed by the sealing material 44 is coated with a metal layer can be used as the optical fiber 24. Even when the sealing material 44 is made of solder, resin, or the like, it is possible to cause the pipe tip 40 to have a higher thermal expansion coefficient than the sealing material 44 as described above. Thereby, a caulking effect by which the pipe tip 40 clamps the sealing material 44 and the optical fiber 24 can be sufficiently obtained at the neck portion 40a and a good airtightness can be ensured.

Further, while the case where the inner diameter D is larger than the length L in the center axis direction at the neck portion 40a of the pipe tip 40 has been described as an example in the above embodiments, the invention is not limited thereto. The inner diameter D is not necessarily required to be larger than the length L at the neck portion 40a, the length L may be equal to the inner diameter D, or the length L may be larger than the inner diameter D.

Further, while the case where the package main unit accommodating the semiconductor laser device 20 is formed of the bottom plate portion 30, the outer frame portion 32, and the lid portion 34 has been described as an example in the above embodiments, the invention is not limited thereto. The package main unit can be formed in any shape with any member as long as an optical device can be accommodated therein.

Further, while the case where the pipe portion 36 is provided to the outer frame portion 32 of the package main unit has been described as an example in the above embodiments, the invention is not limited thereto. The pipe portion 36 may be provided to the package main unit such that the optical fiber 24 inserted therethrough may be optically coupled to an optical device accommodated inside the package main unit.

Figure 8:
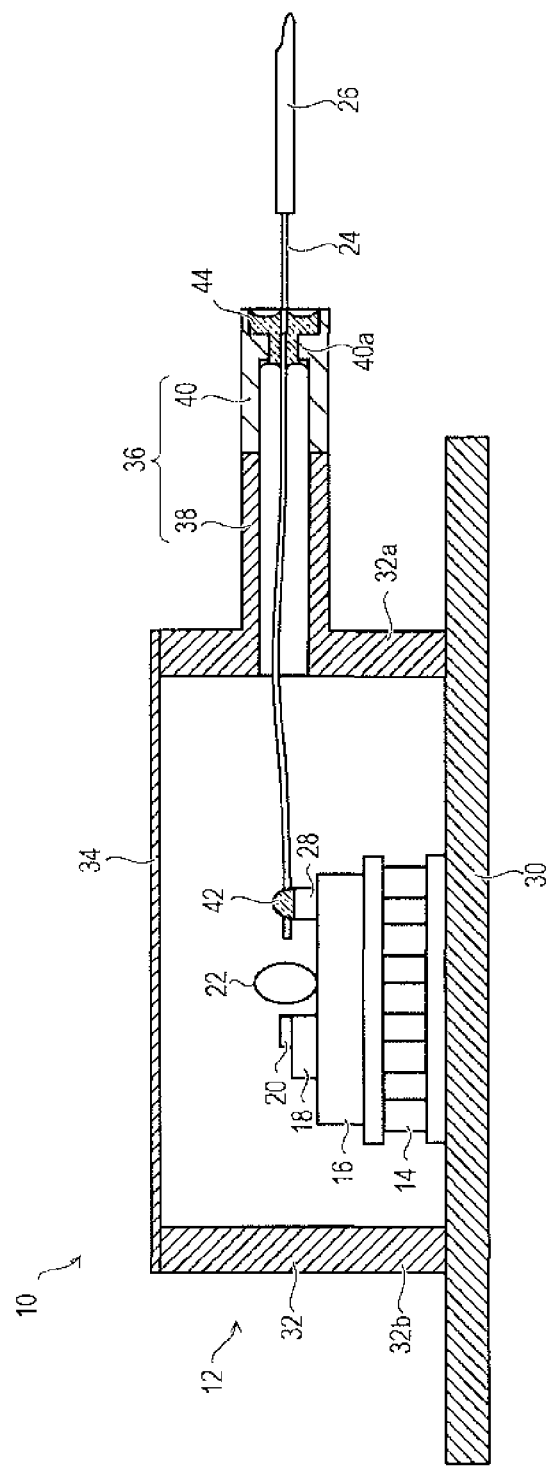
FIG. 8 is a sectional view (part 1) illustrating an optical device module according to a modified embodiment of the present invention.
Figure 9:
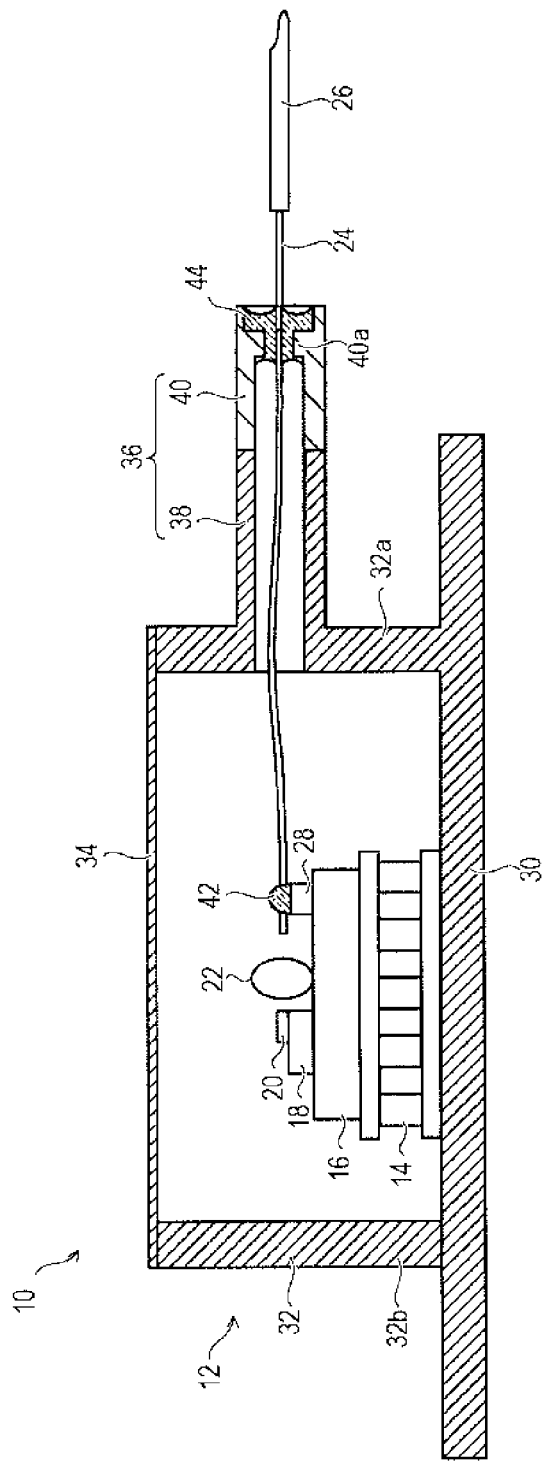
FIG. 9 is a sectional view (part 2) illustrating the optical device module according to the modified embodiment of the present invention.

Further, while the case where the pipe main unit 38 and the outer frame portion 32 are formed separately and the outer frame portion 32 and the bottom plate portion 30 are formed separately has been described as an example in the above embodiments, the invention is not limited thereto. The outer frame portion 32 and the pipe main unit 38 out of the package 12 may be integrally formed as illustrated in FIG. 8. Alternatively, the bottom plate portion 30, the outer frame portion 32, and the pipe main unit 38 in the package 12 may be integrally formed as illustrated in FIG. 9. For example, a component processed by integral molding by a metal injection molding (MIM) method can be used as the integrally formed outer frame portion 32 and the pipe main unit 38 or as the integrally formed bottom plate portion 30, the outer frame portion 32, and the pipe main unit 38. In these cases, the pipe main unit 38 is integrally formed on the front sidewall portion 32a of the outer frame portion 32. At the tip of the pipe main unit 38 integrally formed on the outer frame portion 32, the pipe tip 40 can be joined by silver brazing, laser welding, or the like.

LIST OF REFERENCE NUMERALS

10: optical device module
12: package
20: semiconductor laser device
24: optical fiber
36: pipe portion
38: pipe main unit
40: pipe tip
40a: neck portion
44: sealing material

The invention claimed is:

1. A package for an optical device comprising:
a package main unit that accommodates an optical device;
a pipe portion that is provided in the package main unit and through which an optical fiber optically coupled to the optical device is inserted; and
a fixing portion that is provided in the package main unit and to which one end of the optical fiber is fixed,
wherein the pipe portion includes
a first pipe section having a base end fixed to the package main unit, and
a second pipe section joined to a tip of the first pipe section, the second pipe section comprising a neck portion to be sealed with a sealing material, the neck portion having a smaller inner diameter than any other section of the pipe portion and a larger inner diameter than a length in a center axis direction, wherein the second pipe section having a higher thermal expansion coefficient than the first pipe section and a higher thermal expansion coefficient than the sealing material,
wherein a portion of the optical fiber inserted into the pipe portion is a bare fiber and is sealed only by the sealing material in a hollow portion of the neck portion and a hollow portion of the adjacent section thereof, and a pipe tip of the pipe portion clamps the sealing material and the optical fiber at the neck portion, the sealing material and the optical fiber being caulked.

2. The package for an optical device according to claim 1 wherein the length in the center axis direction of the neck portion is 0.3 to 0.8 mm, and
wherein the inner diameter of the neck portion is 0.5 to 1.0 mm.

3. The package for an optical device according to claim 1, wherein the sealing material is made of a low-melting point glass.

4. The package for an optical device according to claim 1, wherein a thermal expansion coefficient of the first pipe section is $4.5 \times 10^{-6}$ to $6.5 \times 10^{-6}$ per degree Celsius, and
wherein a thermal expansion coefficient of the second pipe section is $7.0 \times 10^{-6}$ to $9.0 \times 10^{-6}$ per degree Celsius.

5. The package for an optical device according to claim 1, Wherein a material of the first pipe section is Kovar, 42 alloy, or ceramic, and
wherein a material of the second pipe section is 42 alloy, 45 alloy, 47 alloy, 50 alloy, 52 alloy, or 78 alloy.

6. The package for an optical device according to claim 1, wherein the optical device is a semiconductor laser device.

7. An optical device module comprising:
the package for the optical device according to claim 1;
the optical device accommodated in the package main unit;
the optical fiber inserted through the pipe portion and having one end fixed to the fixing portion; and
the sealing material sealing the second pipe section through which the optical fiber is inserted.

* * * * *